(12) United States Patent
Iwasaki et al.

(10) Patent No.: US 9,422,635 B2
(45) Date of Patent: Aug. 23, 2016

(54) SINGLE CRYSTAL PRODUCTION APPARATUS AND SINGLE CRYSTAL PRODUCTION METHOD HAVING PEDESTAL WITH GROOVES

(75) Inventors: Atsushi Iwasaki, Echizen (JP); Susumu Sonokawa, Nishishirakawa (JP); Shinobu Takeyasu, Echizen (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 574 days.

(21) Appl. No.: 13/977,864

(22) PCT Filed: Jan. 5, 2012

(86) PCT No.: PCT/JP2012/000020
§ 371 (c)(1),
(2), (4) Date: Jul. 1, 2013

(87) PCT Pub. No.: WO2012/108116
PCT Pub. Date: Aug. 16, 2012

(65) Prior Publication Data
US 2013/0276693 A1     Oct. 24, 2013

(30) Foreign Application Priority Data

Feb. 7, 2011 (JP) ................. 2011-023687

(51) Int. Cl.
| C30B 15/30 | (2006.01) |
| C30B 15/10 | (2006.01) |
| C30B 15/00 | (2006.01) |
| C30B 29/06 | (2006.01) |

(52) U.S. Cl.
CPC ............. *C30B 15/10* (2013.01); *C30B 15/00* (2013.01); *C30B 15/30* (2013.01); *C30B 29/06* (2013.01); *Y10T 117/1072* (2015.01)

(58) Field of Classification Search
CPC ........ C30B 15/00; C30B 15/20; C30B 15/30; C30B 29/00; C30B 29/06; C30B 35/00; C30B 35/002; Y10T 117/00; Y10T 117/10; Y10T 117/1024; Y10T 117/1032; Y10T 117/1072

USPC ........ 117/11, 13, 28, 30, 200, 206, 208, 218, 117/928, 931
See application file for complete search history.

(56) References Cited

U.S. PATENT DOCUMENTS 2,789,442 A * 4/1957 Roano ................. F16H 55/08
74/466
3,551,115 A * 12/1970 Jamieson ................ C30B 15/10
117/217
(Continued)

FOREIGN PATENT DOCUMENTS

| CN | 101423219 A | 5/2009 |
| CN | 201351184 Y | 11/2009 |

(Continued)

OTHER PUBLICATIONS

Jun. 11, 2015 Office Action in Chinese Patent Application No. 201280007837.8.
(Continued)

*Primary Examiner* — Kenneth A Bratland, Jr.
(74) *Attorney, Agent, or Firm* — Oliff PLC

(57) ABSTRACT

A single crystal production apparatus using the Czochralski method, includes: a crucible for holding raw material melt; a pedestal that supports the crucible and can be moved upward and downward; a crucible rotating shaft for rotating the crucible via the pedestal; and a melt receiver that is disposed below the crucible and provided with a center sleeve surrounding the pedestal, wherein, on the outer periphery of the pedestal, two or more grooves for preventing the raw material melt leaking from the crucible from dripping are provided. The single crystal production apparatus and single crystal production method can reliably prevent melt from reaching a metal portion below the pedestal even when the raw material melt in the crucible flows to the outside of the crucible in an unexpected accident or the like and runs down along the pedestal and thereby prevent damage to the apparatus and the occurrence of an accident.

8 Claims, 3 Drawing Sheets

(56) References Cited

U.S. PATENT DOCUMENTS

| | | | |
|---|---|---|---|
| 5,871,582 A | 2/1999 | Kawashima | |
| 6,248,167 B1 * | 6/2001 | Okamoto | C30B 15/00 117/2 |

FOREIGN PATENT DOCUMENTS

| JP | A-4-81254 | 3/1992 |
|---|---|---|
| JP | B2-6-43276 | 6/1994 |
| JP | Y2-2504550 | 7/1996 |
| JP | A-10-130089 | 5/1998 |
| JP | A-10-249512 | 9/1998 |
| JP | 2004-002093 * | 1/2004 |
| JP | A-2004-002093 | 1/2004 |
| JP | A-2006-160538 | 6/2006 |

OTHER PUBLICATIONS

Mar. 6, 2012 International Search Report issued in International Application No. PCT/JP2012/000020.

* cited by examiner

SINGLE CRYSTAL PRODUCTION APPARATUS AND SINGLE CRYSTAL PRODUCTION METHOD HAVING PEDESTAL WITH GROOVES

TECHNICAL FIELD

The present invention relates to a single crystal production apparatus and a single crystal production method that can prevent melt from reaching a metal portion such as a crucible rotating shaft when raw material melt leaks from a crucible and runs down along a pedestal in a single crystal production apparatus using the Czochralski method.

BACKGROUND ART

First, a method for producing a single crystal by using the Czochralski method will be described. In FIG. 3, a schematic sectional view of a conventional single crystal production apparatus is depicted.

A single crystal production apparatus 101 depicted in FIG. 3 includes a main chamber 109a in which a crucible 102 containing raw material melt 104, which is a raw material of a single crystal, is disposed and a pull chamber 109b that is connected to the main chamber 109a, for holding the single crystal 105 pulled from the raw material melt 104 and taking out a single crystal 105.

Near the center of the interior of the main chamber 109a, the crucible 102 containing the raw material melt 104 is disposed. The raw material is melted by causing a heater 103 provided around the crucible 102 to generate heat and the resultant high-temperature raw material melt 104 is held in the crucible 102. Moreover, around the perimeter of the heater 103, a heat insulating cylinder 107 is provided to prevent the heat generated by the heater from escaping and protect the main chamber 109a.

When a seed crystal 108 for the single crystal 105 which is grown while being pulled by a pulling shaft 106 is a silicon single crystal, the crucible that directly holds the raw material melt 104 is a quartz crucible 102a, and, since this quartz crucible 102a is softened at a high temperature and is brittle and fragile, the exterior of the quartz crucible 102a is supported by a graphite crucible 102b.

In addition, in the growth of a single crystal by using the Czochralski method, since the crystal is grown with the crucible 102 and the seed crystal 108 being rotated in opposite directions, a pedestal 110 for supporting the crucible 102 and a crucible rotating shaft 111 for rotating the crucible 102 via the pedestal 110 are attached to a lower part of the graphite crucible 102b.

When a single crystal is produced by using such an apparatus, the following problem arises. The high-temperature raw material melt held in the crucible may flow to the outside of the crucible in an unexpected accident or the like and erode and degrade the crucible rotating shaft, a crucible drive, cooling-water piping, and the like (hereinafter also referred to as metal portions) that are generally disposed below the pedestal and have an exposed metal surface. In particular, when the cooling-water piping is eroded, the apparatus suffers damage, which may result in creating a risk of an accident.

Therefore, in case the crucible holding the raw material melt gets broken and the melt leaks into a furnace, various melt-leak-preventing structures in the production apparatus have been developed.

For example, in an area below the crucible 102 containing the raw material melt 104, a melt draining means (not shown) such as a melt-draining groove, a fin, a flange, and the like is provided, and, in the bottom of the main chamber 109a, a graphite melt receiver 113 provided with a center sleeve 112 is provided (See Patent Document 1). With such a structure, even when a crack appears in the crucible and the melt flows out through the crack, the melt draining unit makes the melt drop into the melt receiver 113 in the bottom of the main chamber 109a, and the melt is stored in the melt receiver 113, whereby the erosion of the metal portions below the pedestal by the high-temperature melt is suppressed.

Moreover, there is a structure in which a receiver (not shown) through which the shaft of the pedestal 110 slidably penetrates is provided at an arbitrary height of the pedestal 110 and the melt leaking from the crucible 102 is received by this receiver (See Patent Document 2).

CITATION LIST

Patent Literature

Patent Document 1: Japanese Examined Patent publication (Koukoku) No. H06-43276
Patent Document 2: Japanese Utility Model Registration No. 2504550

SUMMARY OF INVENTION

Technical Problem

However, in recent years, large-diameter single crystals with a diameter of 300 mm or more have been grown, which inevitably leads to a crucible filled with a large amount of raw material melt, and the amount of melt that leaks when a crack appears in the crucible is increased. Therefore, the melt often flows over the melt draining unit of the melt-leak-preventing structure of Patent Document 1 and reaches the pedestal and sometimes reaches even the metal portions below the pedestal after passing through the space between the center sleeve and the pedestal along the pedestal.

Moreover, in the single crystal production apparatus of Patent Document 2, the receiver is provided in the pedestal. However, since the pedestal can slide on the receiver, the melt sometimes runs down along the pedestal through the space between the pedestal and the receiver in the same manner as described above and reaches even the metal portions below the pedestal.

The present invention has been made in view of the problems described above and an object thereof is to provide a single crystal production apparatus and a single crystal production method that can reliably prevent melt from reaching a metal portion below a pedestal even when raw material melt in a crucible flows to the outside of the crucible in an unexpected accident or the like and runs down along the pedestal and thereby prevent damage to the apparatus and the occurrence of an accident.

Solution to Problem

To attain the above-described object, the present invention provides a single crystal production apparatus using the Czochralski method, including: a crucible for holding raw material melt; a pedestal that supports the crucible and can be moved upward and downward; a crucible rotating shaft for rotating the crucible via the pedestal; and a melt receiver that is disposed below the crucible and provided with a center sleeve surrounding the pedestal, wherein, on the outer periphery of the pedestal, two or more grooves for preventing the raw material melt leaking from the crucible from dripping are provided.

With such a single crystal production apparatus provided with the grooves, when a crack appears in the crucible and the raw material melt leaking to the outside of the crucible runs down along the pedestal, the raw material melt slowly flows along the grooves provided on the outer periphery of the pedestal, whereby most of the leaked melt is solidified before running down from the pedestal to other parts below the pedestal. This makes it possible to prevent the metal portions below the pedestal, particularly the crucible rotating shaft, cooling-water piping, from being eroded by the high-temperature raw material melt and prevent damage to the apparatus and the occurrence of an accident.

Moreover, a very simple structure in which two or more grooves are provided in the pedestal makes it possible to obtain the effect of the present invention easily and at low cost.

Moreover, it is preferable that the grooves of the pedestal are provided in a 15% to 100% area of the entire length of the pedestal in a vertical direction.

When the grooves are formed in such an area, the effect of the present invention can be adequately obtained.

Furthermore, on the inner periphery of the center sleeve, two or more grooves may be provided.

By doing so, even when the raw material melt flowing along the outer periphery of the pedestal runs down to the side where the center sleeve is located, as in the case of the pedestal, it is possible to solidify the leaked raw material melt also on the side where the center sleeve is located before the leaked raw material melt reaches the metal portions below the pedestal.

In addition, as in the case of the pedestal, since this is also a very simple structure, it is possible to obtain a better effect of the present invention easily and at low cost.

Moreover, it is preferable that the grooves of the center sleeve are provided in a 50% to 100% area of the entire length of the center sleeve in a vertical direction.

When the grooves are formed in such an area, the effect of the present invention can be adequately obtained.

Furthermore, it is preferable that the grooves of any one of the pedestal and the center sleeve or both have a depth of 2 mm or more but 10 mm or less and a width of 5 mm or more but 20 mm or less, and the spacing between the grooves is 5 mm or more but 20 mm or less.

With such grooves, it is possible to make the leaked raw material melt remain in the grooves more effectively without affecting the strength of any one of the pedestal and the center sleeve or both.

Furthermore, it is preferable that the grooves of any one of the pedestal and the center sleeve or both have a reservoir portion for storing part of the leaked raw material melt.

With such grooves, it is possible to make the leaked raw material melt remain in the grooves more effectively and solidify the leaked raw material melt reliably before the leaked raw material melt reaches the metal portions below the pedestal.

Moreover, it is preferable that the space between the pedestal and the center sleeve is 2 mm or more but 5 mm or less.

By doing so, oxides and the like do not accumulate in the space between the pedestal and the center sleeve and do not interfere with the up-and-down movement of the pedestal. Moreover, when the raw material melt leaking from the crucible drips down and runs down along the pedestal, by stopping the flow of the raw material melt between the pedestal and the center sleeve and solidifying the raw material melt, it is possible to prevent the raw material melt from directly reaching the crucible rotating shaft, which makes it possible to produce a single crystal more safely and reliably.

Furthermore, the present invention provides a single crystal production method using the Czochralski method, comprising producing, in a chamber, a single crystal by pulling the single crystal from raw material melt while heating the raw material melt in a crucible with a heater, wherein the single crystal is produced by using the single crystal production apparatus of the present invention.

With such a single crystal production method, it is possible to prevent the metal portions below the pedestal from being eroded by the high-temperature raw material melt leaking from the crucible and prevent damage to the apparatus and the occurrence of an accident; it is possible to produce a single crystal safely while preventing degradation of the metal portions of the production apparatus.

Advantageous Effects of Invention

As described above, according to the present invention, when raw material melt leaking to the outside of a crucible as a result of a crack appearing in the crucible runs down along a pedestal, by making the raw material melt drop slowly, it is possible to solidify the leaked raw material melt. Therefore, it is possible to prevent metal portions below the pedestal, particularly a crucible rotating shaft and cooling-water piping, from being eroded by the high-temperature raw material melt and therefore prevent damage to an apparatus and the occurrence of an accident.

DESCRIPTION OF EMBODIMENTS

Hereinafter, embodiments of the present invention will be described specifically with reference to the drawings by taking up as an example the production of a silicon single crystal, but the present invention is not limited thereto.

Figure 1:
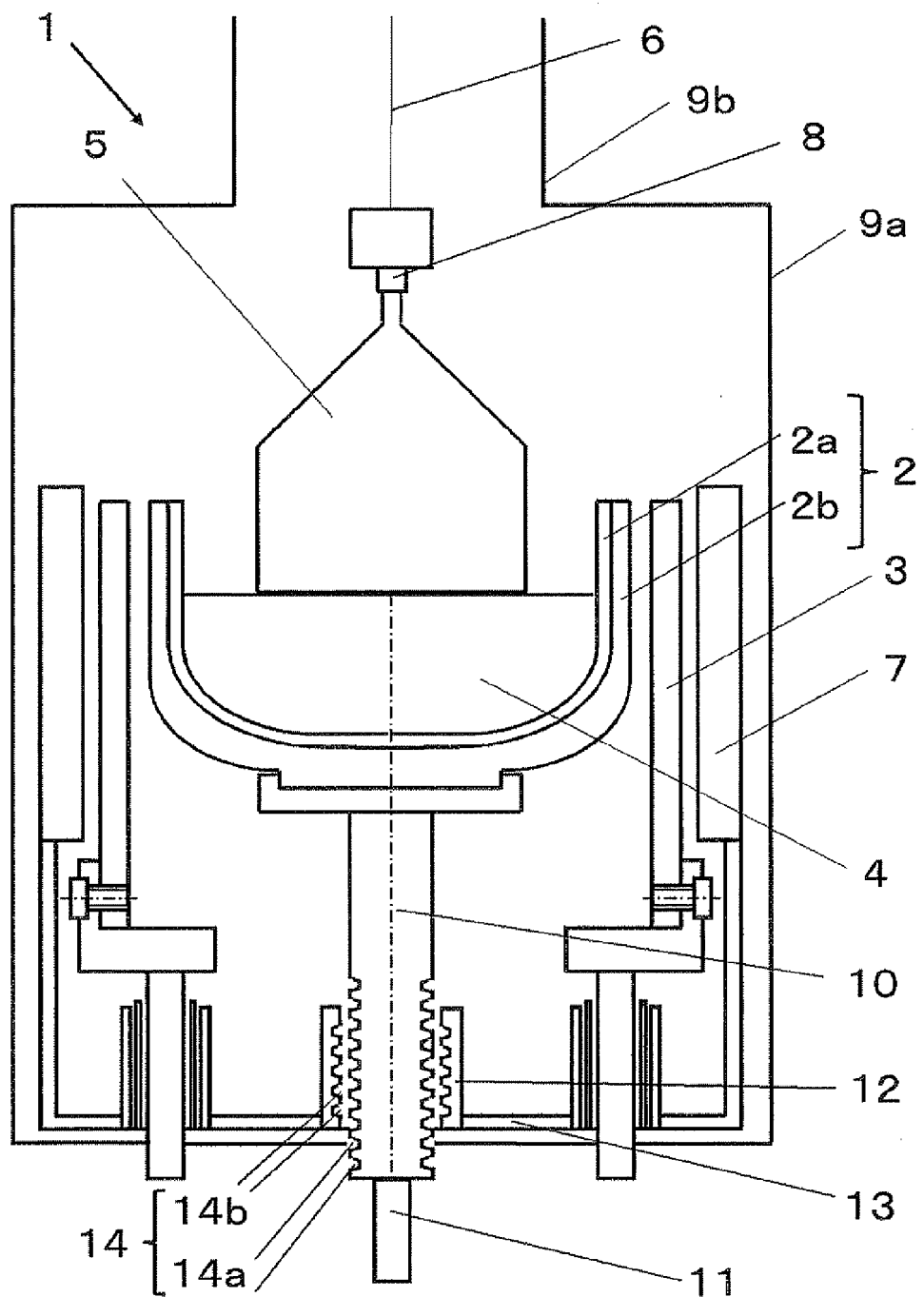
FIG. 1 is a diagram of an example of a schematic sectional view of a single crystal production apparatus of the present invention.

First, an example of a schematic sectional view of a single crystal production apparatus of the present invention is depicted in FIG. 1. The single crystal production apparatus 1 of the present invention has an appearance formed as a hollow cylindrical chamber, and the chamber is constituted of a main chamber 9a forming a lower cylinder and a pull chamber 9b, connected and fixed to the main chamber 9a, forming an upper cylinder.

At the center thereof, a crucible 2 is disposed, and the crucible has a double structure constituted of a quartz crucible 2a and a graphite crucible 2b suited to hold the exterior of the quartz crucible 2a.

Outside the crucible 2 having the double structure, a heater 3 is disposed, and a heat insulating cylinder 7 is disposed concentrically around the outside of the heater 3.

The silicon raw material of a predetermined weight that is charged into the crucible 2 is melted, and raw material melt 4 is formed. Then, a seed crystal 8 is dipped in the surface of the raw material melt 4 thus formed, and a silicon single crystal 5 is grown on a lower end surface of the seed crystal 8 by pulling a pulling shaft 6 upward.

Moreover, a pedestal 10 for supporting the crucible 2 and a crucible rotating shaft 11 for rotating the crucible 2 are provided below the crucible 2.

Furthermore, in the bottom of the main chamber 9a, a melt receiver 13 for receiving the raw material melt 4 leaking from the crucible 2 in an unexpected accident or the like is provided. In the melt receiver 13, a center sleeve 12 is provided in such a way as to surround the pedestal 10. At this time, by using an isotropic graphite material as the material of the pedestal 10, the center sleeve 12, and the melt receiver 13, it is possible to make them resistant to deformation even when they contact the raw material melt 4.

Here, the pedestal 10 and the center sleeve 12 are disposed in such a way that the space between them is 2 mm or more but 5 mm or less. It is preferable that the width of the space is within this range because this can eliminate the possibility that oxides or the like accumulate in the space and interfere with the up-and-down movement of the crucible 2 and prevent the raw material melt 4 leaking from the crucible 2 from directly reaching a metal portion such as the crucible rotating shaft 11.

Here, on the outer periphery of the pedestal 10, two or more grooves 14a are provided in a 15% to 100% area of the entire length of the pedestal 10 in a vertical direction. It is preferable that two or more grooves 14b are provided also on the inner periphery of the center sleeve 12 in a 50% to 100% area of the entire length of the center sleeve 12 in a vertical direction.

The grooves 14 of the pedestal and the center sleeve prevent the raw material melt 4 leaking from the crucible 2 in an unexpected accident or the like from dripping down along the outer periphery of the pedestal 10 or the inner periphery of the center sleeve 12.

Figure 2:
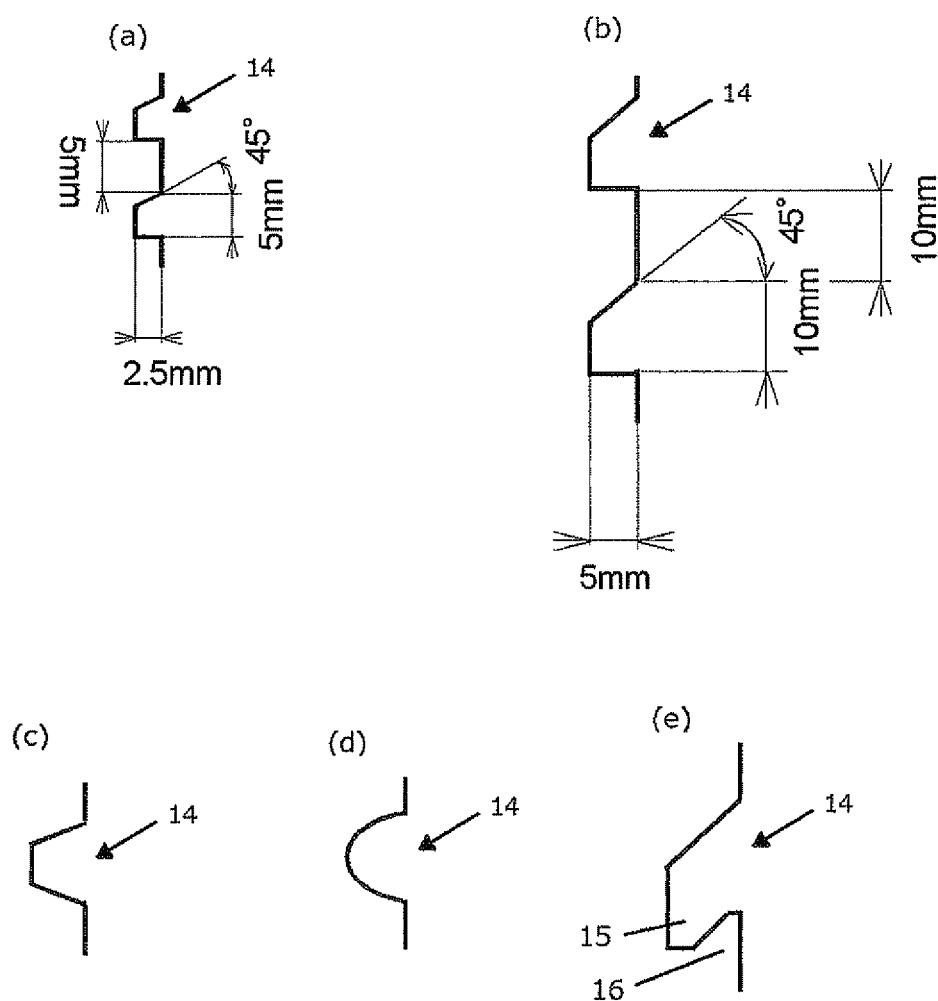
FIG. 2 is a diagram of an example of a schematic sectional view of a groove in the present invention.

At this time, it is preferable that the depth of the groove 14 is set at 2 mm or more but 10 mm or less, the width thereof is set at 5 mm or more but 20 mm or less, and the spacing between the grooves is set at 5 mm or more but 20 mm or less. For example, though not limited to the following values, as depicted in FIG. 2 at (a), the depth can be set at 2.5 mm, the width can be set at 5 mm, and the spacing can be set at 5 mm. As depicted in FIG. 2 at (b), the depth can be set at 5 mm, the width can be set at 10 mm, and the spacing can be set at 10 mm.

Furthermore, the shape of the groove 14 may be for example, an isosceles trapezoidal shape depicted in FIG. 2 at (c) or a semielliptical shape depicted in FIG. 2 at (d), preferably, a trapezoidal shape depicted in FIG. 2 at (a) or FIG. 2 at (b), or more preferably, a shape in which a reservoir portion 15 is formed by forming a projecting portion 16 depicted in FIG. 2 at (e).

As depicted in FIG. 2 at (a) and FIG. 2 at (b), a trapezoidal groove 14 whose upper side is inclined at an angle of 45° or less is preferable because the raw material melt 4 easily enter the groove 14 and easily slow down after entering the groove 14.

Furthermore, the shape having the reservoir portion 15 enables the raw material melt 4 leaking from the crucible 2 to remain efficiently in the reservoir portion 15 in the groove 14 and solidify the leaked raw material melt 4 reliably before the leaked raw material melt 4 reaches the metal portion such as the crucible rotating shaft 11.

Moreover, as a method for disposing the grooves 14, it is preferable, for example, to dispose the grooves 14 at regular intervals or in a spiral fashion, but the present invention is not limited thereto. The effect of the present invention can also be obtained by disposing the grooves 14 at irregular intervals. It is preferable to provide the grooves 14 in a relatively lower part of the pedestal 10 or the center sleeve 12 because the position of the grooves is comparatively away from a high-temperature portion near the crucible 2 so that the leaked melt is easy to be cooled and solidified.

Here, in a single crystal production method of the present invention, the production of a single crystal is performed in the following manner by using such an apparatus. It goes without saying that the present invention is not limited to the production method described below.

First, in the single crystal production apparatus depicted in FIG. 1, the seed crystal 8 is dipped in the raw material melt 4 held by the crucible 2. Then, the seed crystal 8 is pulled while being rotated by the pulling shaft 6. At this time, heating by the heater 3 is performed and the crucible 2 is rotated by the crucible rotating shaft 11 in a direction opposite to the direction in which the seed crystal 8 is rotated, whereby the single crystal 5 is produced.

At this time, in the pedestal 10 for supporting the crucible 2 and in the center sleeve 12 disposed in the melt receiver 13 for receiving the raw material melt 4 leaking from the crucible 2, the grooves 14, each having a depth of 2 mm or more but 10 mm or less and a width of 5 mm or more but 20 mm or less, are disposed at regular intervals or in a spiral fashion, and the grooves 14 are formed with the reservoir portions 15 depicted in FIG. 2(e). The grooves 14a are arranged with a spacing of 5 mm or more but 20 mm or less.

At this time, the grooves 14 are disposed at a lower part of the pedestal 10 in a 15% to 100% area of the entire length thereof in a vertical direction and also in a 50% to 100% area of the center sleeve in a vertical direction. The pedestal 10 and the center sleeve 12 are disposed in such a way that the space between them is 2 mm or more but 5 mm or less.

Since such grooves 14 are formed in the pedestal 10 and the center sleeve 12, even when the raw material melt 4 leaks from the crucible 2 in an unexpected accident or the like during production of a single crystal, the raw material melt 4 slowly flows along the grooves 14 of the pedestal 10 or the center sleeve 12.

As a result, the leaked raw material melt 4 is solidified before reaching the metal portions below the pedestal 10; therefore the leaked raw material melt 4 does not erode and degrade these metal portions, and it is possible to prevent damage to the apparatus and the occurrence of an accident.

EXAMPLE

The present invention will be described below more specifically by an example and a comparative example, but the present invention is not limited to these examples.

Example

In the single crystal production apparatus of the present invention depicted in FIG. 1, in the pedestal and the center sleeve, the grooves, each having a depth of 5 mm and a width of 10 mm that was arranged with a spacing of 10 mm as depicted in FIG. 2 at (b), and formed into a shape with the reservoir portions as depicted in FIG. 2 at (e) were disposed at regular intervals. The grooves were disposed at a lower part of the pedestal within a 50% area of the entire length of the pedestal in a vertical direction, and at the whole area of the entire length of the center sleeve in a vertical direction. At this time, 150 kg of silicon polycrystalline raw material was charged into a quartz crucible with a diameter of 800 mm, and a single crystal with a diameter of 300 mm was grown. The grown single crystal was taken out, and then the silicon polycrystalline raw material was recharged. In a batch, a melt leak occurred right after the completion of recharging, power was immediately turned off to ensure safety. After the crucible was cooled, when the chamber was opened to check the interior of the furnace, it was seen that part of the melt leaking from the crucible had reached the pedestal, but the raw material melt was solidified and stopped in a position of about ⅓ of the area of the pedestal in which the grooves were formed and did not reach the crucible rotating shaft.

Comparative Example

Figure 3:
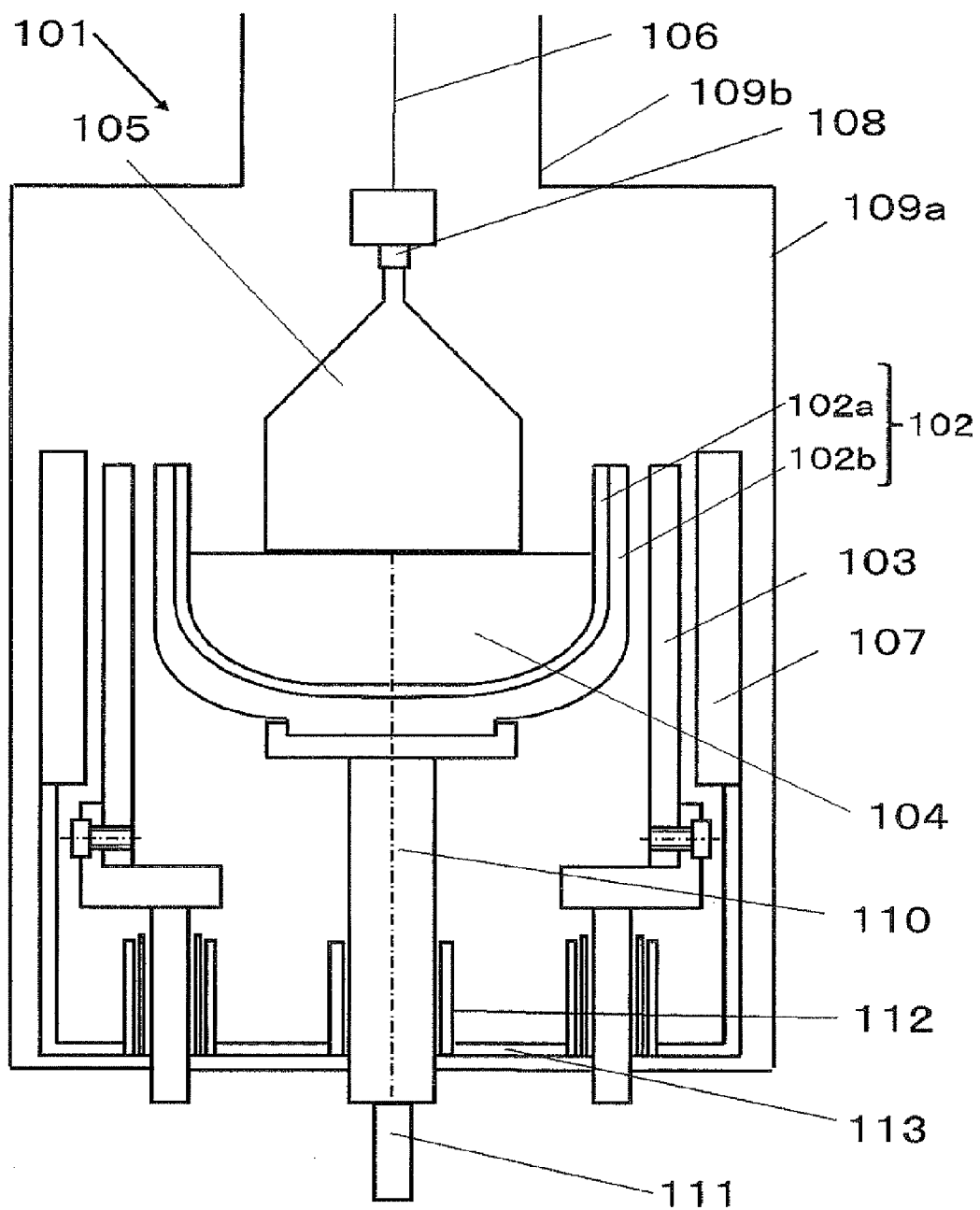
FIG. 3 is a diagram of an example of a schematic sectional view of a conventional single crystal production apparatus.

Except that no groove was provided in the pedestal and the center sleeve in the conventional single crystal production apparatus depicted in FIG. 3, a single crystal was produced in the same manner as in Example. The grown single crystal was taken out, and then the silicon polycrystalline raw material was recharged. In a batch, a melt leak occurred right after the completion of recharging, power was immediately turned off to ensure safety. After the crucible was cooled, when the chamber was opened to check the inside of the furnace, it was seen that part of the melt leaking from the crucible had reached the pedestal and run down along the pedestal to the crucible rotating shaft.

As a result, in Comparative Example, since part of the leaked raw material melt reached the crucible rotating shaft, the surface of the crucible rotating shaft was damaged. The amount of the raw material melt leaking from the crucible was small and about 10 kg, and the amount of the melt that reached the crucible rotating shaft was only about 30 g; therefore the damage to the crucible rotating shaft was just the burned surface thereof.

However, assuming that the amount of the melt leaking from the crucible was several times larger than 10 kg, it could be considered that the amount of melt that would reach the crucible rotating shaft also increased several times and the apparatus might be damaged or an accident might occur.

In Example, the amount of the raw material melt leaking from the crucible was larger than that of Comparative Example described above and was nearly 50 kg and the amount of the melt that ran down along the pedestal was also nearly five times that of Comparative Example, but the raw material melt spread all around the pedestal or the center sleeve along the grooves, the melt gradually built up in each groove and was solidified, and the whole amount of the raw material melt that flowed down the grooves was solidified after reaching a position of about ⅓ of the area in which the grooves were formed.

As a result of the above verification, it could be considered that with the single crystal production apparatus of the present invention, even assuming that the whole amount of raw material melt leaked, the melt rarely reached the crucible rotating shaft and other metal portions.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A single crystal production apparatus using a Czochralski method, the single crystal production apparatus comprising:
    a crucible for holding raw material melt;
    a pedestal that supports the crucible and can be moved upward and downward;
    a crucible rotating shaft for rotating the crucible via the pedestal; and
    a melt receiver that is disposed below the crucible and provided with a center sleeve surrounding the pedestal, wherein
    on an outer periphery of the pedestal and an inner periphery of the center sleeve, two or more grooves for preventing the raw material melt leaking from the crucible from dripping are provided,
    the grooves of any one or both of the pedestal and the center sleeve have a depth of 2 mm or more and 10 mm or less and a width of 5 mm or more and 20 mm or less, and a spacing between the grooves is 5 mm or more and 20 mm or less, and
    a space between an outermost surface of the pedestal and an innermost surface of the center sleeve is 2 mm or more and 5 mm or less.

2. The single crystal production apparatus according to claim 1, wherein
    the grooves of the pedestal are provided in a 15% to 100% area of an entire length of the pedestal in a vertical direction.

3. The single crystal production apparatus according to claim 1, wherein
    the grooves of the center sleeve are provided in a 50% to 100% area of an entire length of the center sleeve in a vertical direction.

4. The single crystal production apparatus according to claim 2, wherein
    the grooves of the center sleeve are provided in a 50% to 100% area of an entire length of the center sleeve in a vertical direction.

5. The single crystal production apparatus according to claim 1, wherein
    the grooves of any one of the pedestal and the center sleeve or both have a reservoir portion for storing part of the leaked raw material melt.

6. The single crystal production apparatus according to claim 4, wherein
    the grooves of any one of the pedestal and the center sleeve or both have a reservoir portion for storing part of the leaked raw material melt.

7. A single crystal production method using a Czochralski method, the method comprising producing, in a chamber, a single crystal by pulling the single crystal from raw material melt while heating the raw material melt in a crucible with a heater, wherein
    the single crystal is produced by using the single crystal production apparatus according to claim 1.

8. A single crystal production method using a Czochralski method, the method comprising producing, in a chamber, a single crystal by pulling the single crystal from raw material melt while heating the raw material melt in a crucible with a heater, wherein
    the single crystal is produced by using the single crystal production apparatus according to claim 6.

* * * * *